(12) United States Patent
Shen

(10) Patent No.: US 11,373,931 B1
(45) Date of Patent: Jun. 28, 2022

(54) LID ALLOWING FOR LIQUID METAL THERMAL INTERFACING MATERIALS IN A LIDDED FLIP CHIP PACKAGE

(71) Applicant: Yuci Shen, San Jose, CA (US)

(72) Inventor: Yuci Shen, San Jose, CA (US)

( * ) Notice: Subject to any disclaimer, the term of this patent is extended or adjusted under 35 U.S.C. 154(b) by 0 days.

(21) Appl. No.: 17/141,241

(22) Filed: Jan. 5, 2021

(51) Int. Cl.
*H01L 23/473* (2006.01)
*H01L 23/31* (2006.01)
*H01L 23/367* (2006.01)
*H01L 23/42* (2006.01)

(52) U.S. Cl.
CPC ............ *H01L 23/473* (2013.01); *H01L 23/31* (2013.01); *H01L 23/3675* (2013.01); *H01L 23/42* (2013.01)

(58) Field of Classification Search
CPC ... H01L 23/473; H01L 23/31; H01L 23/3675; H01L 23/42
See application file for complete search history.

(56) References Cited

U.S. PATENT DOCUMENTS

2020/0168523 A1* 5/2020 Huang ................ H01L 21/4871

* cited by examiner

*Primary Examiner* — Peniel M Gumedzoe

(57) ABSTRACT

The disclosure describes a lid allowing for a liquid thermal interface material (TIM) in a lidded flip chip package. The lid includes a reservoir structure so that a liquid system can be formed in the lidded flip chip package, allowing for a liquid TIM in the gap between the lid and the flip chip. The reservoir structure comprises a seal ring, a connecting hole and a reservoir which is a tunnel for taking in a liquid material and releasing it again from and to the gap according to the change of the gap volume. The lid further includes an injection hole and a plug for filling and removing liquid into or from the gap and reservoir. The lid further includes a plurality of pins, which extrude downwards from the bottom surface of the lid so as to strongly bond with the substrate of the flip chip package through an adhesive.

16 Claims, 19 Drawing Sheets

LID ALLOWING FOR LIQUID METAL THERMAL INTERFACING MATERIALS IN A LIDDED FLIP CHIP PACKAGE

TECHNICAL FIELD OF THE DISCLOSURE

The disclosure relates generally to a heat-dissipating object for dissipating heat from a heat-generating object in an electronic device, and particularly to a lid for a lidded flip chip package to use a liquid thermal interface material (TIM).

BACKGROUND OF THE DISCLOSURE

In a flip chip package with a semiconductor chip being a heat-generating object, a thermal interface material (TIM) is usually used to fill the gap between the flip chip and a heat-dissipating object, like a lid or a heat sink for transferring the heat from one to the other. The types of the TIM basically include thermal pad, thermal grease, phase change material and liquid metal. A good TIM needs to have 1) a high thermal conductivity, 2) a good surface wetting capability for reducing the thermal contact resistance, 3) a good gap filling capability, and 4) a good thermal reliability in test or application. A liquid metal as TIM usually includes gallium and gallium alloy. The melting point of the gallium is about 29° C., and that of gallium alloy is even lower. The thermal conductivity of the liquid metal is much higher than the extensively used thermal pad or thermal grease. Furthermore, a liquid metal has much better capability for surface wetting and gap filling. So, of all the types of TIM, a liquid metal is an ideal TIM if only looking at the first three items. If a liquid metal can be used in a lidded flip chip package, the temperature of the lidded flip chip package can be reduced significantly as compared to other types of TIM. However, the conventional lidded flip chip packages based on a conventional lid of prior arts are limited to use a liquid metal as its TIM due to the pumping-out issue, that is, when the package is under a thermal cycling test or in its long term of application, the volume of the gap between the flip chip and the lid varies with temperature due to the warpage of the flip chip, causing the liquid metal TIM to be pumped out. The TIM pumping-out issue will cause an incomplete gap filling between the flip chip and the lid, reducing the thermal performance of TIM. And the more important thing is that because a liquid metal is electrically conductive, a small amount of TIM pumping-out may damage the whole electronic device. As a result, a liquid metal type of TIM has not been commercially used in a lidded flip chip package. In general, because of the similar reason, a liquid metal type of TIM is rarely interposed between a heat-dissipating object (a heat sink, for example) and a heat-generating object (a semiconductor chip, for example) in an electronic device.

For overcoming the TIM pumping-out issue for an electronic device such as a lidded flip chip package to use a liquid TIM, a lid coupled with a reservoir structure has been disclosed in the prior art, U.S. Ser. No. 10/643,924 B1. However, the lid of the prior art has two disadvantages in its application. To eliminate the two disadvantages, a lid and its lidded flip chip package are described in the present disclosure of the present invention.

SUMMARY OF THE DISCLOSURE

A lid allowing for a liquid thermal interface material (TIM) in a lidded flip chip package, comprising: the lid, consisting of a top piece, which has a top surface and a bottom surface and a plurality of pins; and a reservoir structure comprising: a reservoir, a seal ring, and a connecting hole, wherein the top piece of the lid has a ring-form of slot on its bottom surface and the seal ring is mounted in the ring-form of slot, the seal ring directly sealing a peripheral edge region at a top surface of the flip chip with a portion on the bottom surface of the top piece, providing a gap between a portion of the bottom surface of the top piece and a portion of the top surface of the flip chip, and the gap being entirely filled with the liquid, wherein the reservoir is a tunnel in the top piece of the lid, which has an opening to the ambient, and the tunnel being partially filled with the liquid, wherein the connecting hole has an end at a portion of the bottom surface of the top piece surrounded by the seal ring, and another end connecting to the reservoir, wherein the top piece of the lid has an injection hole and a plug, the injection hole has an end at a portion of the bottom surface of the top piece surrounded by the seal ring, and another end at a portion of the bottom surface of the top piece is closed by the plug, and wherein the plurality of pins extrude downwards from the portion of the bottom surface of the top piece outside the seal ring and form an array of pins, and an adhesive material fills among the pins and between the pins and the substrate of the lidded flip chip package so as to bond the lid with the substrate.

A method for making the lid allowing for a liquid thermal interface material (TIM) in a lidded flip chip package, comprising the following major steps:
1) Prepare a piece of material,
2) Form a spiral pattern of slot and a ring-form of slot at the bottom surface of the piece of material,
3) Form two through holes for making a connecting hole and an injection hole,
4) Form a rectangular slot for connecting the two through holes,
5) Form a ring-form of covering piece, a bridging bar, a plug and a seal ring,
6) Bond the ring-form of covering piece onto the bottom surface of the piece of material, covering the spiral pattern of tunnel to form a spiral pattern of tunnel,
7) Mount the bridging bar into the rectangular slot for forming a connecting hole from the spiral pattern of tunnel to a portion of the bottom surface of the piece of material surrounded by the ring-form of slot,
8) Place the plug into the injection hole,
9) Mount the seal ring into the ring-form of slot.

The features and advantages of the embodiments of the present disclosure will become more apparent from the detailed descriptions in conjunction with the drawings below. The drawings and associated descriptions are to illustrate the embodiments of the present disclosure, not to limit the scope of what is claimed.

DETAILED DESCRIPTION OF THE PREFERRED EMBODIMENT

Figure 1:
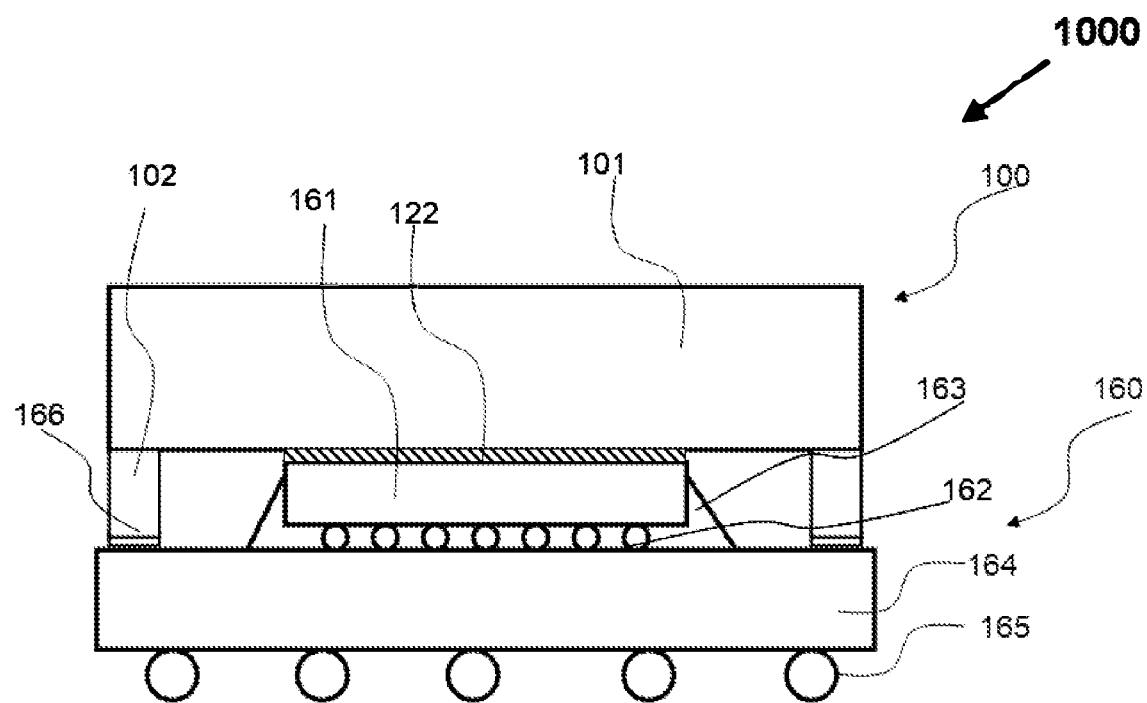
FIG. 1 is a schematic diagram for illustrating a conventional lidded flip chip package of prior arts.
Figure 2:
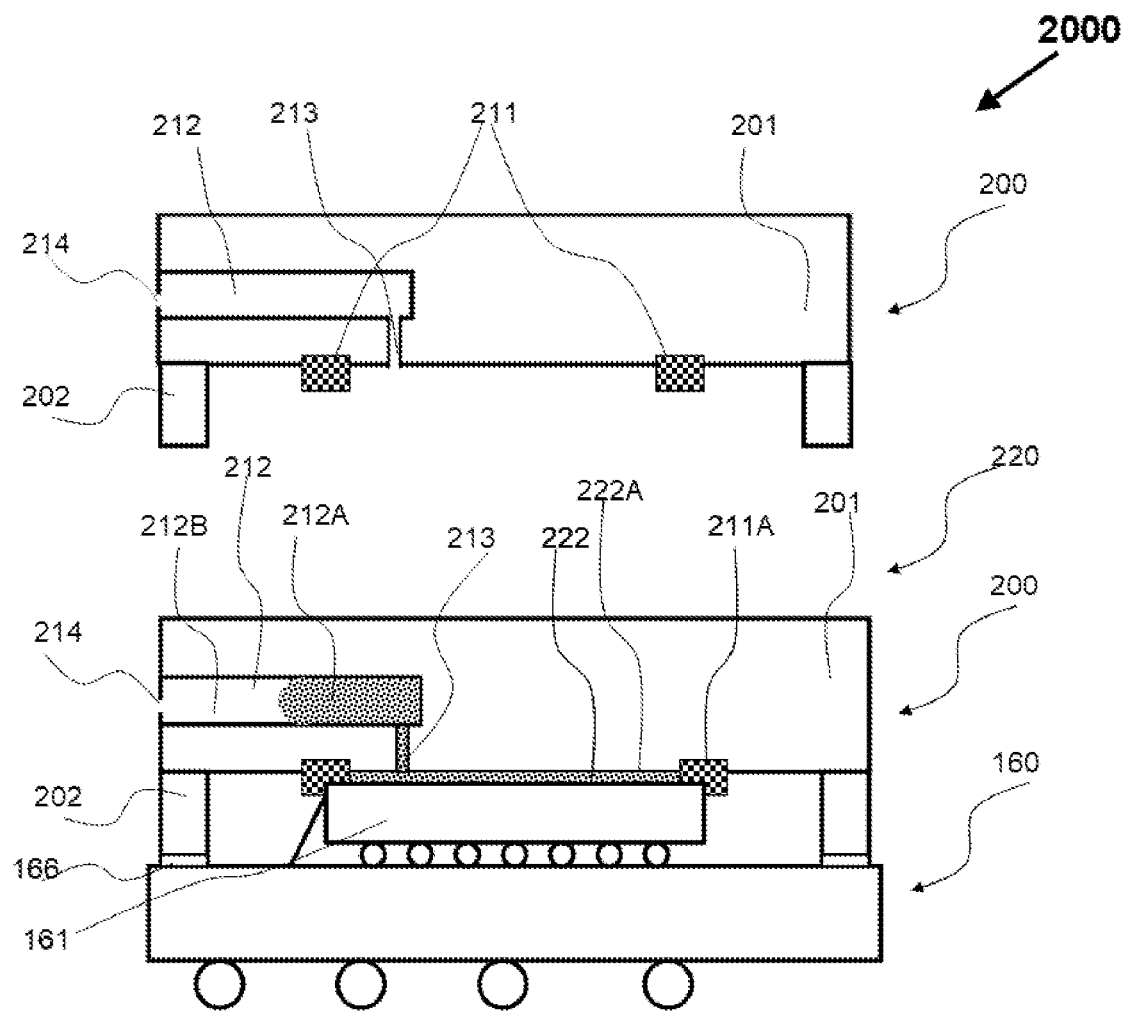
FIG. 2 is a schematic diagram for illustrating a lidded flip chip package of prior art, U.S. Ser. No. 10/643,924 B1.
Figure 3:
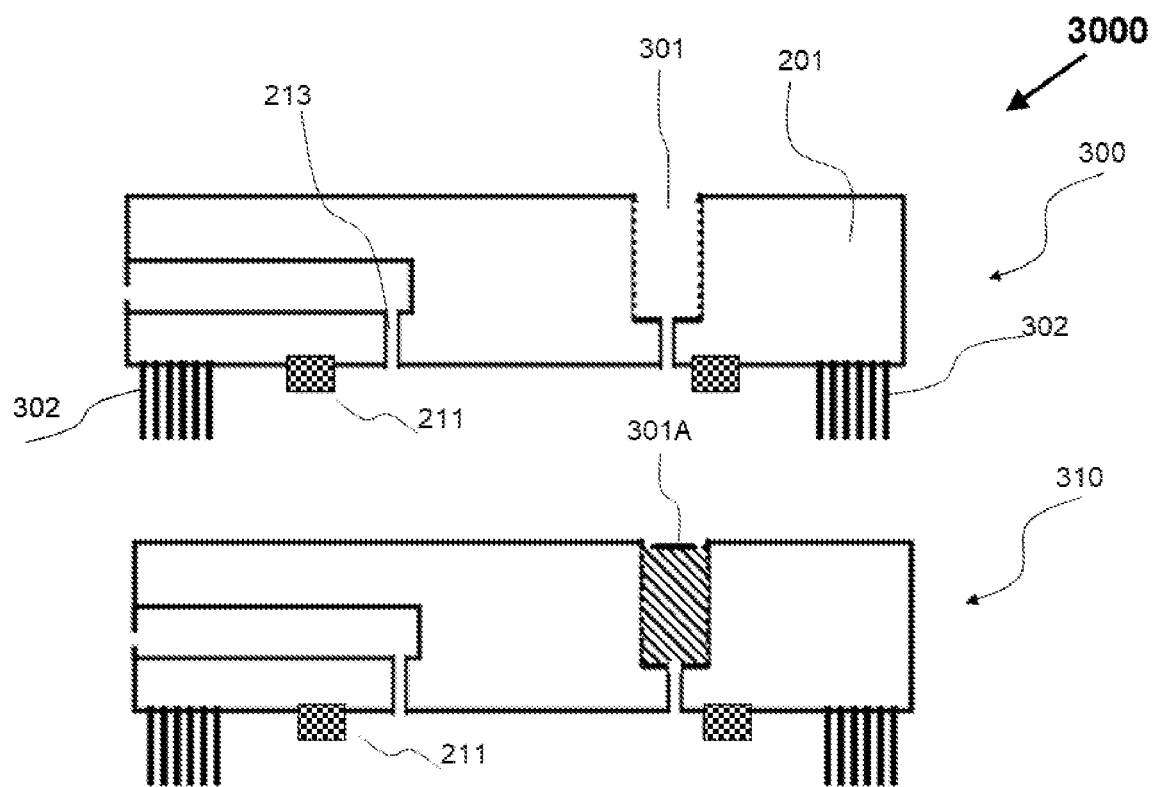
FIG. 3 to FIG. 6 are schematic diagrams for illustrating the features of a lid for a lidded flip chip package to use a liquid TIM of one preferred embodiment of the present invention.

FIG. 1 and FIG. 2 are used to explain some terms associated with a lid, a lidded flip chip package and a thermal interface material (TIM), and to describe the challenges about using a liquid TIM in a lidded flip chip package of prior arts.

FIG. 1 is a schematic diagram for illustrating a conventional lidded flip chip package. The numerical symbol 1000 in FIG. 1 designates a conventional lidded flip chip package, in which the numerical symbol 100 designates a conventional lid, including a top piece 101 and a side wall 102, the numerical symbol 160 designates a flip chip package, including a flip chip 161 and a substrate 164 with solder balls 165, the bumps 162 and the under fill material 163, the numerical symbol 166 designates an adhesive material for bonding the lid 100 onto the substrate 160, and the numerical symbol 122 designates a thermal interface material (TIM) which is placed in the gap between the top piece 101 and the flip chip 161. It is noted that the flip chip package 160 is not always flat, but warps downwards or upwards at low or high temperature due to the CTE (coefficient of thermal expansion) mismatch between the flip chip 161 and the substrate 164, causing the volume change of the gap between the flip chip 161 and the top piece 101. As a result, a liquid TIM is easy to be pumped out, causing a challenge for a conventional lidded flip chip package to use a liquid TIM.

FIG. 2 is a schematic diagram for illustrating a lid for a lidded flip chip package to use a liquid TIM of the prior art. The numerical symbol 2000 in FIG. 2 designates the lid 200 and the lidded flip chip package 220 based on the lid 200, wherein the lid 200 includes a reservoir structure, and the lidded flip chip package 220 includes a reservoir system based on the reservoir structure, deviating them from the conventional ones. In additional to the top piece 201 and side wall 202, the lid 200 includes a reservoir structure, consisting of a seal ring 211 mounted on its bottom surface of the top piece 201, a reservoir 212 in the top piece 201, and a connecting hole 213, starting from a portion of the bottom surface of the top piece 201 and connecting to the reservoir. The end of the connecting hole at the bottom surface of the top piece is called an inner end and the other end of the connecting hole is called an outer end. The seal ring region of the bottom surface of the lid means the portion of the bottom surface of the lid surrounded by the seal ring. The reservoir 212 is a tunnel for taking in a liquid material and releasing it again when needed. The 214 designates an opening of the reservoir 212, which opens to the ambient. After attaching the lid 200 on the flip chip package 160 through the adhesive 166 and filling a liquid in the gap and reservoir, the lidded flip chip package 220 to use a liquid TIM of the prior art is formed, wherein the lidded flip chip package 220 includes a reservoir system, which consists of the reservoir 212 of the lid, the connecting hole 213 of the lid, a sealed gap 222, and a liquid material 222A/212A, the gap between the lid 220 and the flip chip 161 is sealed at the peripheral edge region of the flip chip 161 by the seal ring 211A, forming the sealed gap 222, the reservoir 212 is a tunnel in the top piece of the lid, the connecting hole 213 is between the sealed gap 222 and the reservoir 212 for connecting one with the other, and a liquid material is entirely filled in the sealed gap 222, and partially filled in the reservoir 212. The 222A and 212A respectively designate the liquid material in the gap 222 and reservoir 212, and the 212B designates the empty space in the reservoir 212. The liquid material 222A forms a liquid TIM between the flip chip 161 and lid 200. It is seen that when the volume of the sealed gap 222 gets smaller, the reservoir 212 can take in the excessive amount of liquid material from the sealed gap 222 to its empty space 212B, keeping the pressure inside the sealed gap 222 not to be high, and when the volume of the sealed gap 222 gets larger, the reservoir 212 can release the needed amount of liquid material into the sealed gap 222 from its stored liquid material 212A, keeping the sealed gap 222 to be entirely filled all the time. It is noted that the reservoir 212 needs to have an opening 214 so that the liquid material can flow between the gap and the reservoir when the gap volume changes.

The lidded flip chip package 220 based on the lid 200 designated by the numerical symbol 2000 in FIG. 2 of the prior art has two disadvantages in its application. One is that it is not easy to fill and remove a liquid material into and from the reservoir structure. As a result, when the package 220 is analyzed by a cross-sectional cutting, the liquid may flow out, causing messy anywhere. And the other is that the delaminating risk between the adhesive 166 and the side wall 202 of the lid is high due to an additional stress caused by the compressed seal ring 211A. The present invention is to eliminate the two disadvantages of the prior art by introducing an injection hole with a plug in the top piece of the lid and a plurality of pins to replace the side wall, which is described in conjunction with the drawings in the following.

Figure 4:
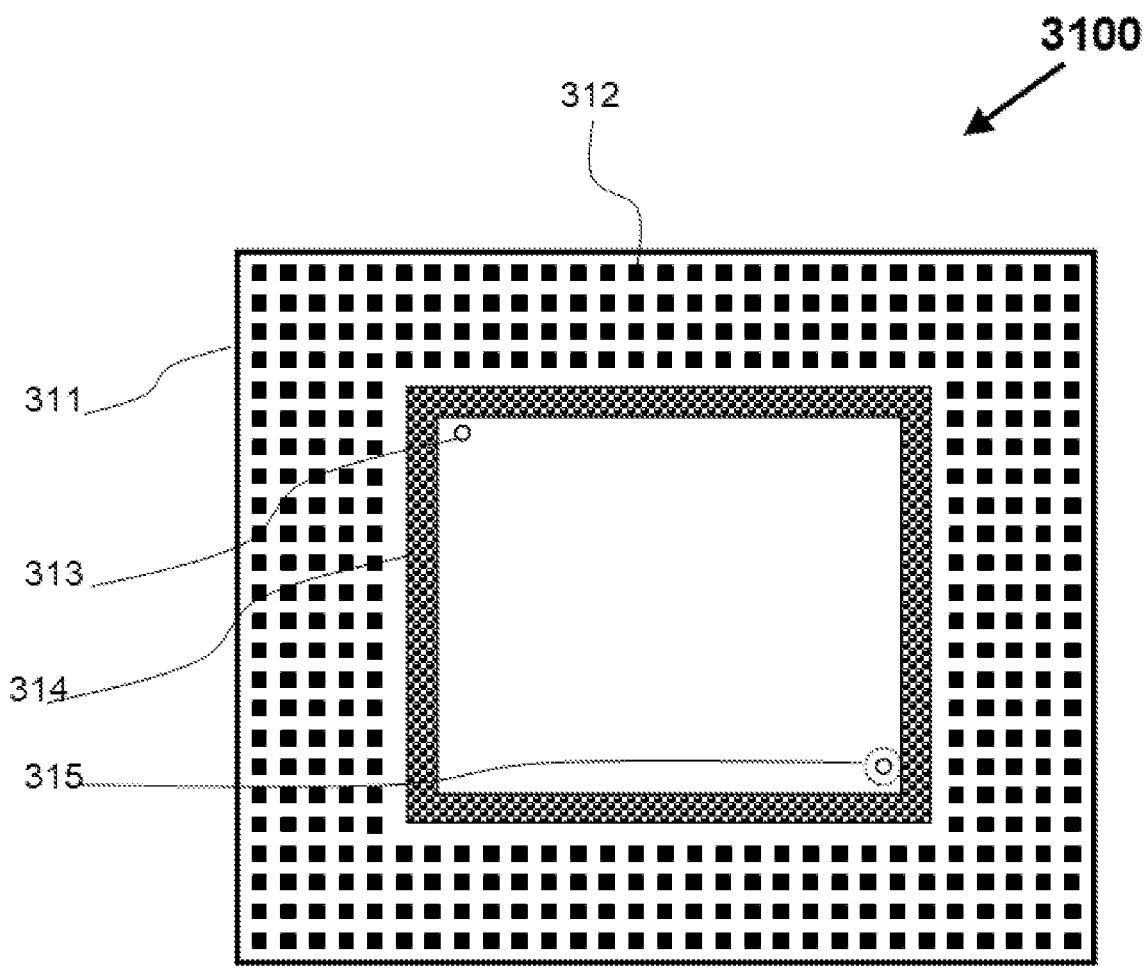
Figure 5:
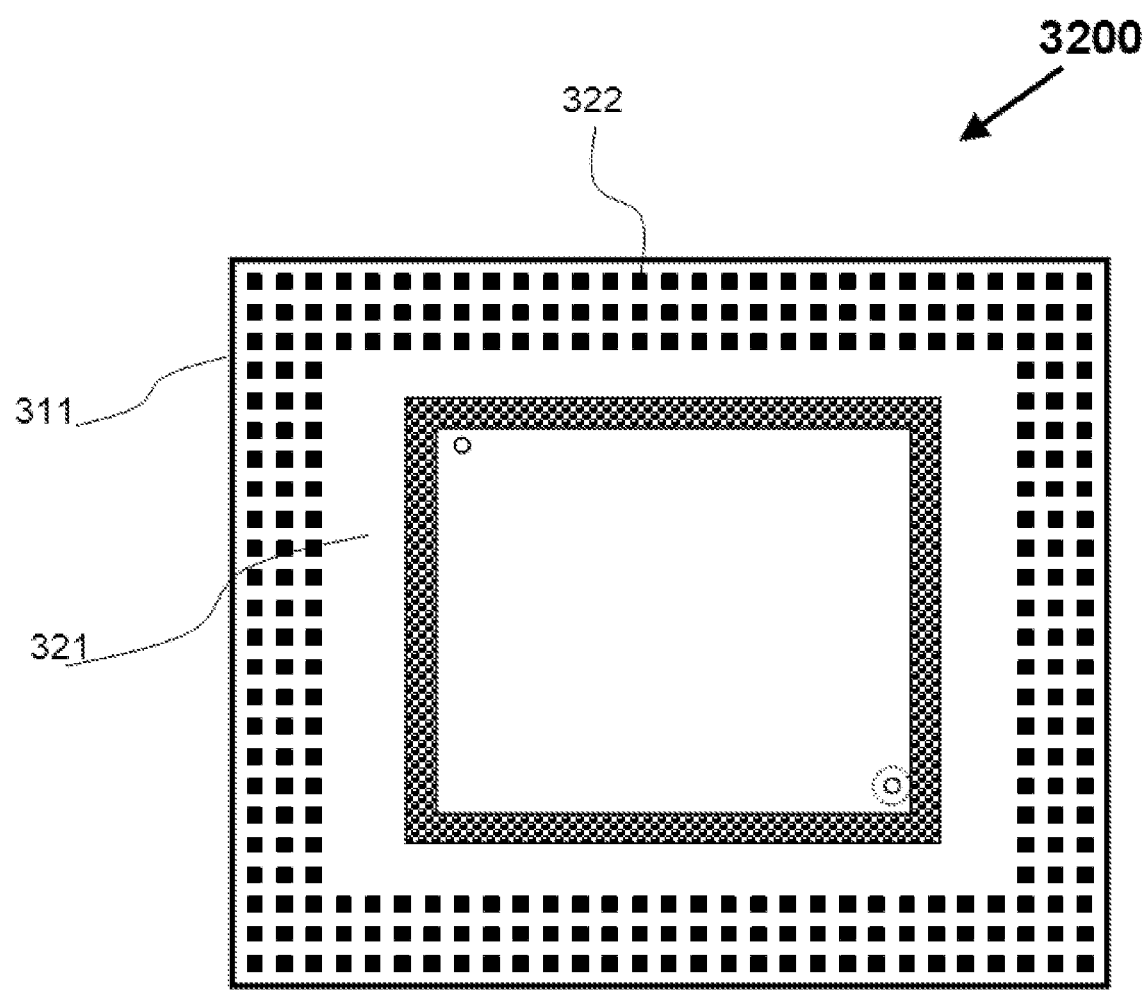
Figure 6:
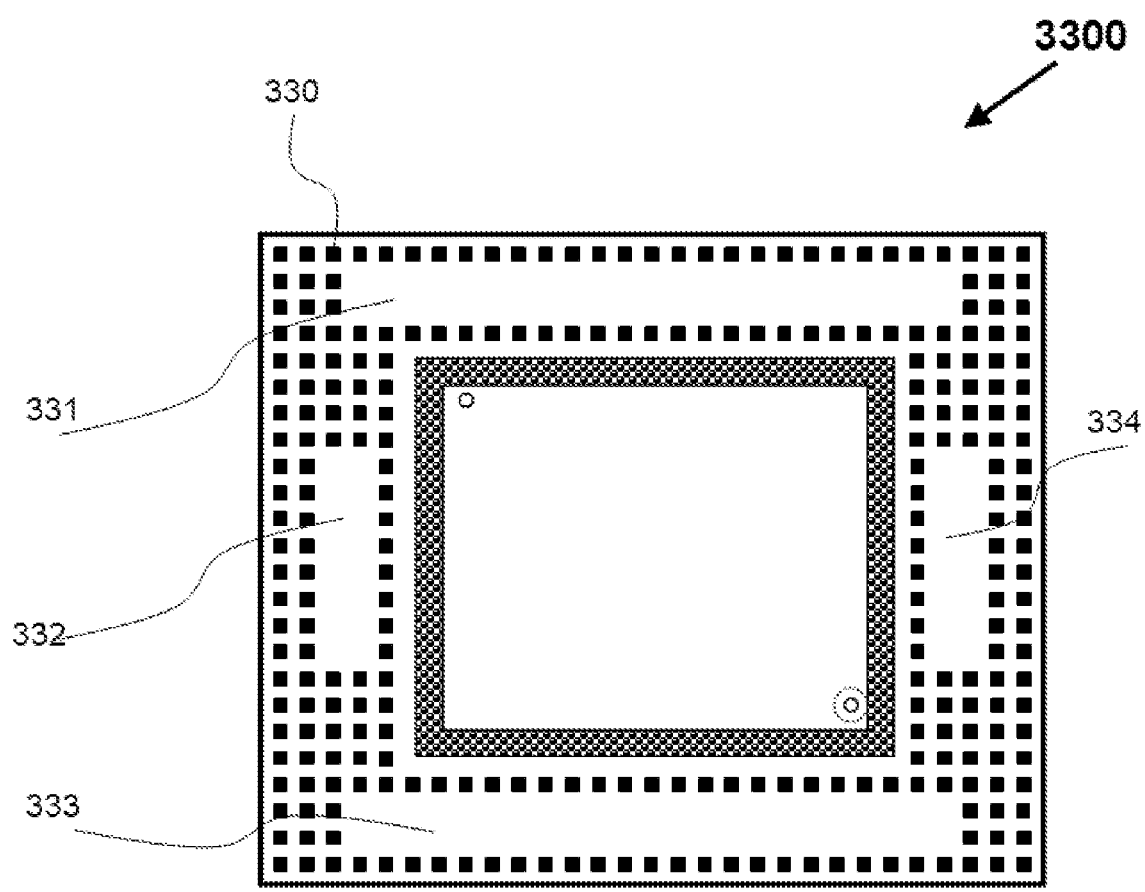

FIG. 3 to FIG. 6 are schematic diagrams for illustrating a lid of one preferred embodiment of the present invention. The numerical symbol 3000 in FIG. 3 designates the cross-sectional view of the lid, in which the 300 designates a lid which includes an injection hole 301 and a plurality of pins 302 as a replacement of the side wall of the lid 200 of the prior art as showed in FIG. 2, and the 301A in the lid 310 designates a plug for closing the injection hole 301. The pins extrude downwards from the bottom surface of the top piece and may have various arrays. The numerical symbol 3100 in FIG. 4 designates the bottom view of a lid of one preferred embodiment of the present invention, in which the numerical symbols 311 and 312 designate the top piece of the lid and the pins with a full array on the portion of the bottom surface of the top piece outside the seal ring 314, and the 313 and 315 designate the bottom view of the connecting hole 213 and the injection hole 301. The numerical symbol 3200 in FIG. 5 designates the bottom view of a lid of one preferred embodiment of the present invention, in which the pins 322 form a peripheral array, providing a ring-form of cavity 321 surrounding the seal ring. The numerical symbol 3300 in FIG. 6 designates the bottom view of a lid of another preferred embodiment of the present invention, in which the pins 330 form an array with some cavities 331, 332, 333, and 334. It is noted that the arrays of the pins can be flexibly designed according to the requirement of a specific application, and those showed in FIG. 4 to FIG. 6 are only some examples.

Figure 7:
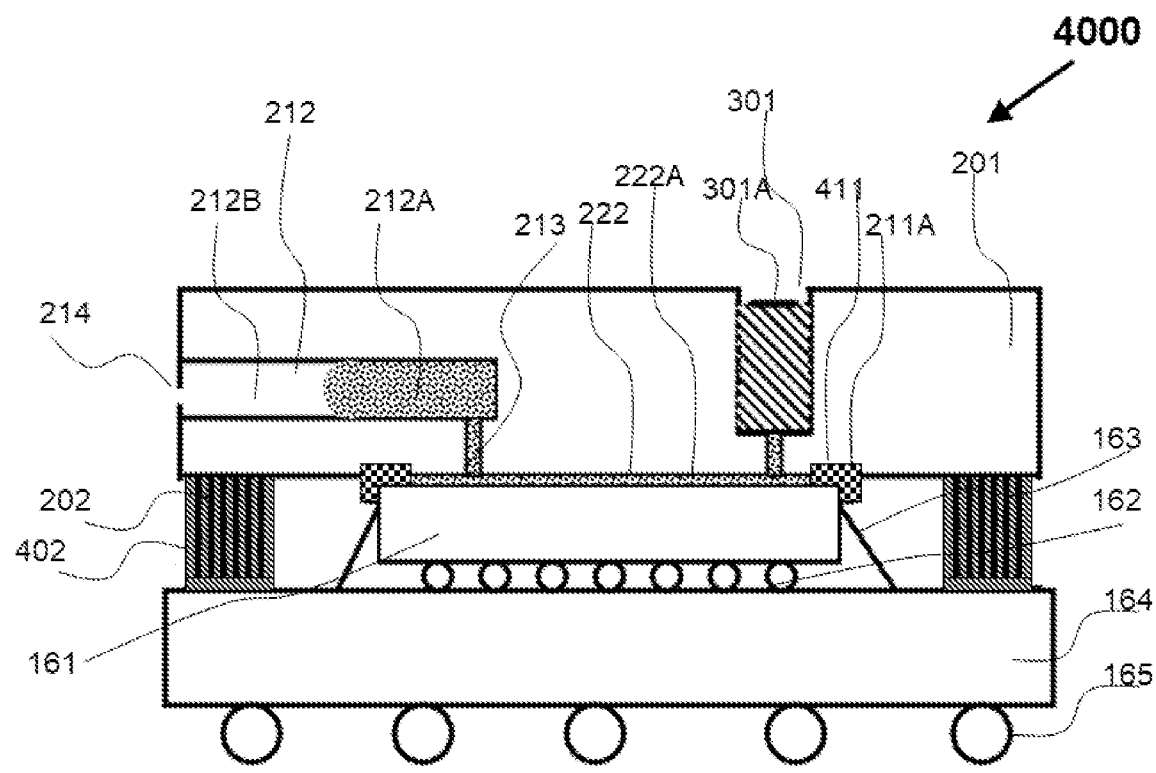
FIG. 7 is a schematic diagram for illustrating a lidded flip chip package with liquid TIM based on the present lid of one preferred embodiment of the present invention.

FIG. 7 is a schematic diagram for illustrating a lidded flip chip package of one preferred embodiment of the present invention. The numerical symbol 4000 in FIG. 7 designates a lid allowing for a liquid TIM in a lidded flip chip package, comprising: the lid consisting of a top piece 201, which has a top surface and a bottom surface, a plurality of pins 202, and a reservoir structure comprising: a reservoir 212, a seal ring 212A, and a connecting hole 213, wherein the top piece 201 of the lid has a ring-form of slot 411 on its bottom surface and the seal ring 211A is mounted in the ring-form of slot 411, the seal ring directly sealing a peripheral edge region at a top surface of the flip chip 161 with a portion on the bottom surface of the top piece, providing a gap 222 between a portion of the bottom surface of the top piece 201 and a portion of the top surface of the flip chip 161, and the gap being entirely filled with the liquid 222A, wherein the reservoir 212 is a tunnel in the top piece 201 of the lid, which has an opening 214, which opens to the ambient, and the tunnel 212 being partially filled with the liquid 212A, wherein the connecting hole 213 has an end at a portion of the bottom surface of the top piece 201 surrounded by the seal ring, and another end connecting to the reservoir 212, wherein the top piece of the lid has an injection hole 301 and a plug 301A, the injection hole has an end at a portion of the bottom surface of the top piece surrounded by the seal ring, and another end at a portion of the top surface of the top piece is closed by the plug 301A, and wherein the plurality of pins 202 extrude downwards from the portion of the bottom surface of the top piece outside the seal ring and form an array of pins, and an adhesive material 402 fills among the pins and between the pins and the substrate 164 of the lidded flip chip package so as to bond the lid with the substrate.

Figure 8:
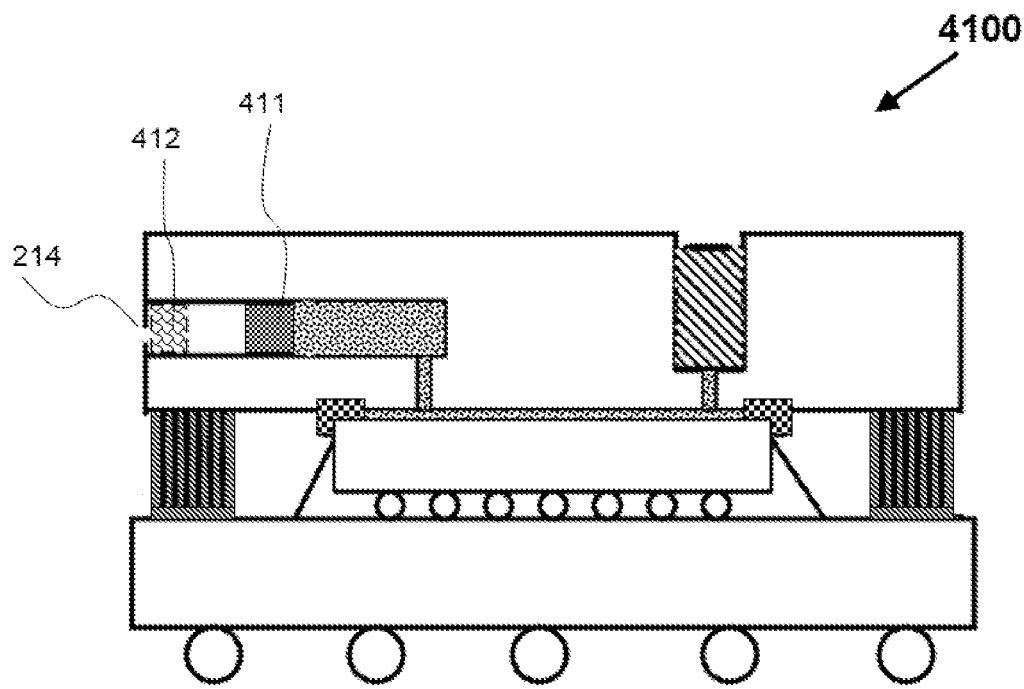
FIG. 8 a schematic diagram for illustrating some more features of the lidded flip chip package with liquid TIM based on the present lid of one preferred embodiment of the present invention.

FIG. 8 is a schematic diagram for illustrating some more features of the lidded flip chip package 4000 showed in FIG. 7 of one preferred embodiment of the present invention. The numerical symbol 4100 in FIG. 8 designates a lidded flip chip package, which further composites a foam block 412 in the tunnel and near the opening 214. The foam block allows the air to pass freely but does not allow the liquid in the reservoir to leak out easily. When the liquid in the reservoir and the gap for a liquid TIM is a liquid metal such as a gallium or its alloys, the lidded flip chip package further composites another non-metallic liquid or grease material 411 at the outer end of the liquid metal in the reservoir for preventing the liquid metal from exposing to the air because liquid metal can be oxidized when being exposed to the air under high temperature and long time. The 411 can also be a movable block as an option.

Figure 9:
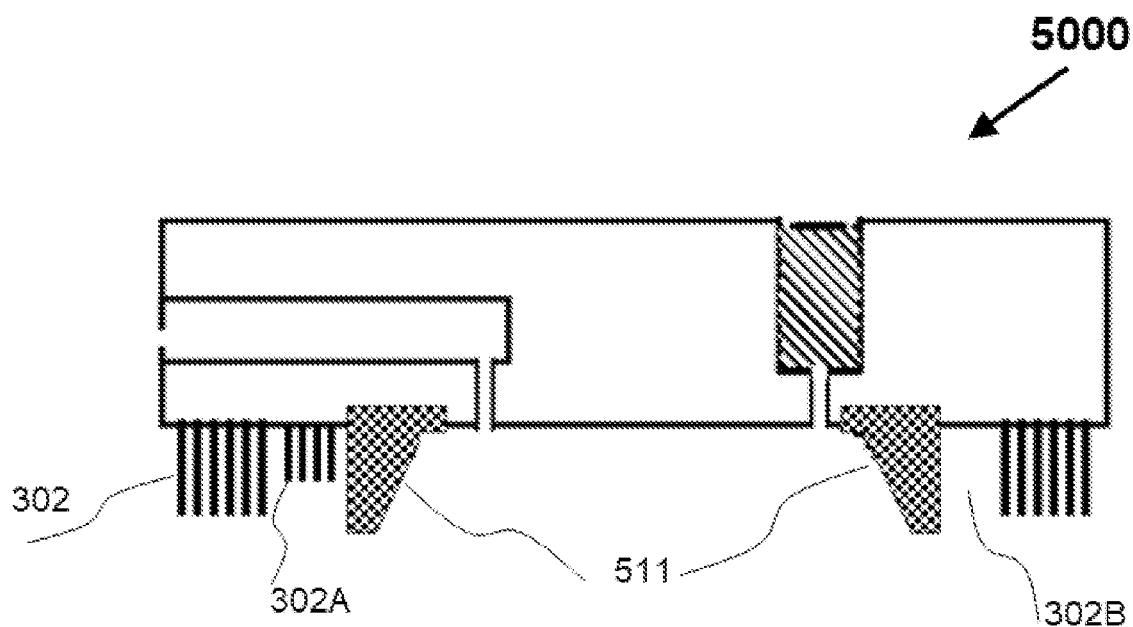
FIG. 9 is a schematic diagram for illustrating some more features of a lid for a lidded flip chip package to use a liquid TIM of another preferred embodiment of the present invention.

FIG. 9 is a schematic diagram for illustrating the variations of the array of pins and the structure of the seal ring of the lid of one preferred embodiment of the present invention. The 302A and 302B designate some shorter pins and a cavity in the array of pins 302 of the lid 5000, and the 511 designates a preferred seal ring, which has a structure to further seal at the sides of the flip chip and the under fill filet at the sides of the flip chip as showed in FIG. 10 below.

Figure 10:
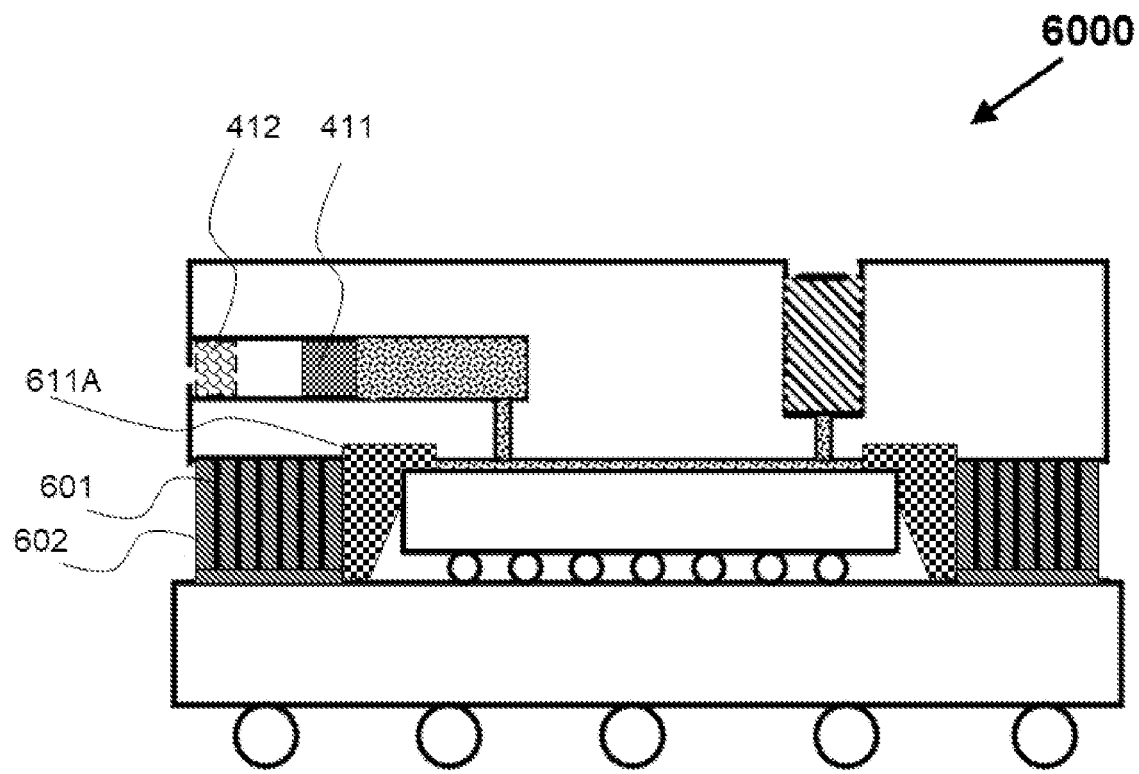
FIG. 10 is a schematic diagram for illustrating a lidded flip chip package with liquid TIM based on the present lid of another preferred embodiment of the present invention.
Figure 11:
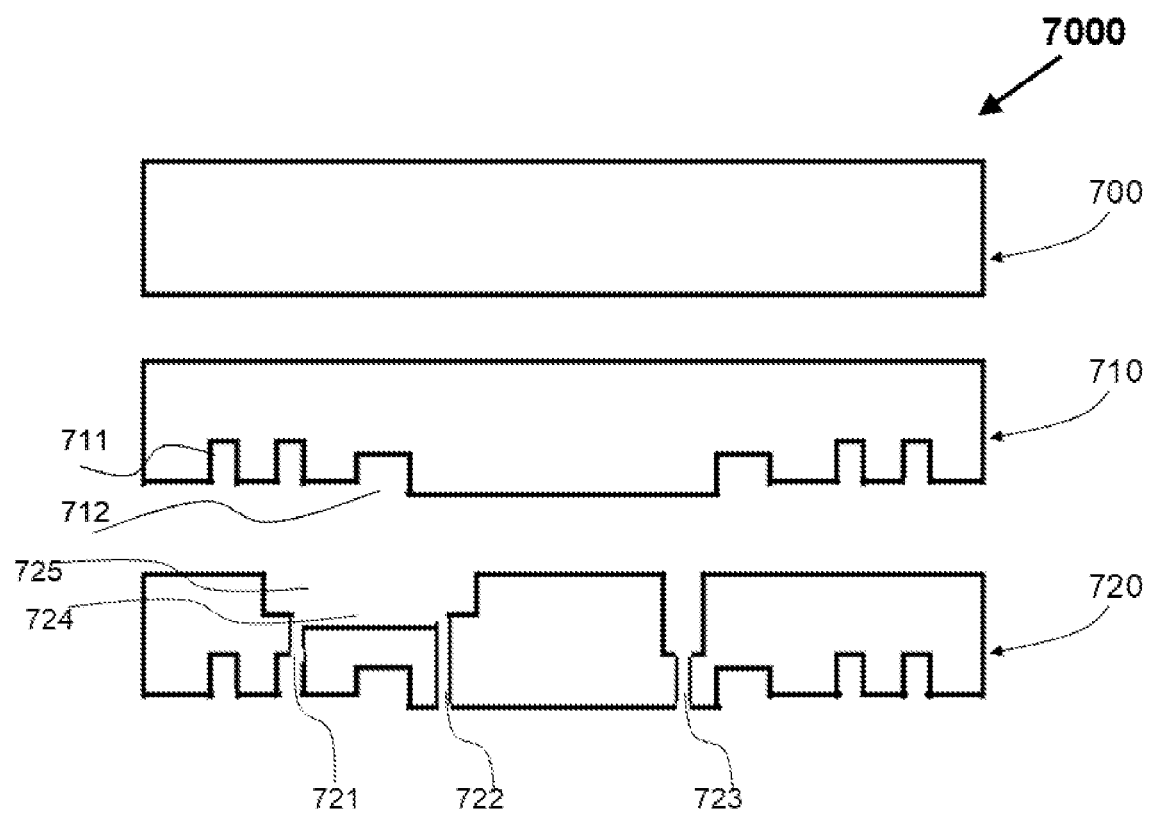
FIG. 11 to FIG. 14 are schematic diagrams for illustrating the steps of a method for making a lid, wherein some tunnels, slots and holes are formed of one preferred embodiment of the present invention.

FIG. 10 is a schematic diagram for illustrating a lid allowing for a liquid TIM in a lidded flip chip package of one preferred embodiment of the present invention. The numerical symbol 6000 in FIG. 10 designates a lid allowing for a liquid TIM in a lidded flip chip package, wherein the seal ring 611A seals at the peripheral edge region of the flip chip and further seals at the sides of the flip chip and the under fill filet at the sides of the flip chip, and the adhesive 602 entirely fills the full array of pins and cavity between the pins and the seal ring.

Figure 12:
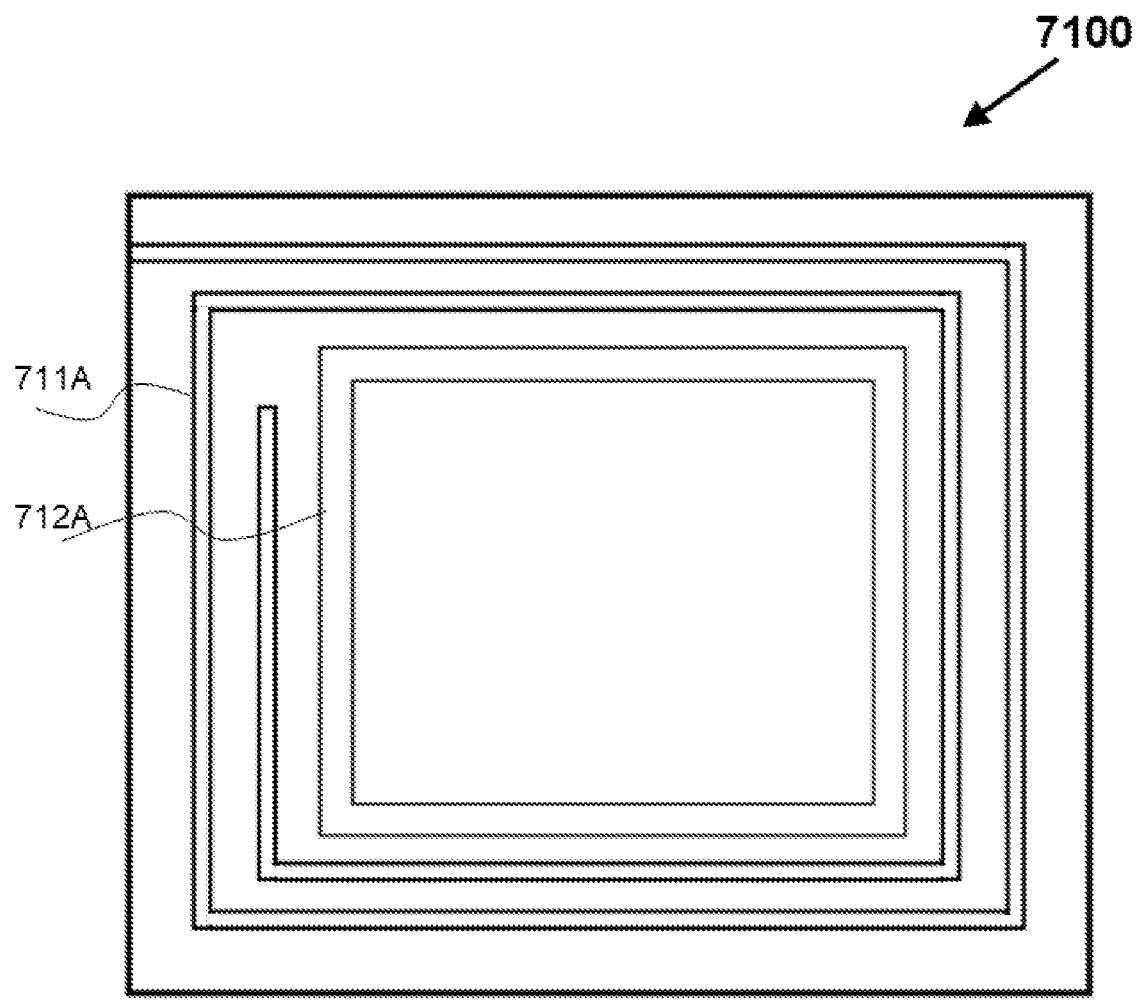
Figure 13:
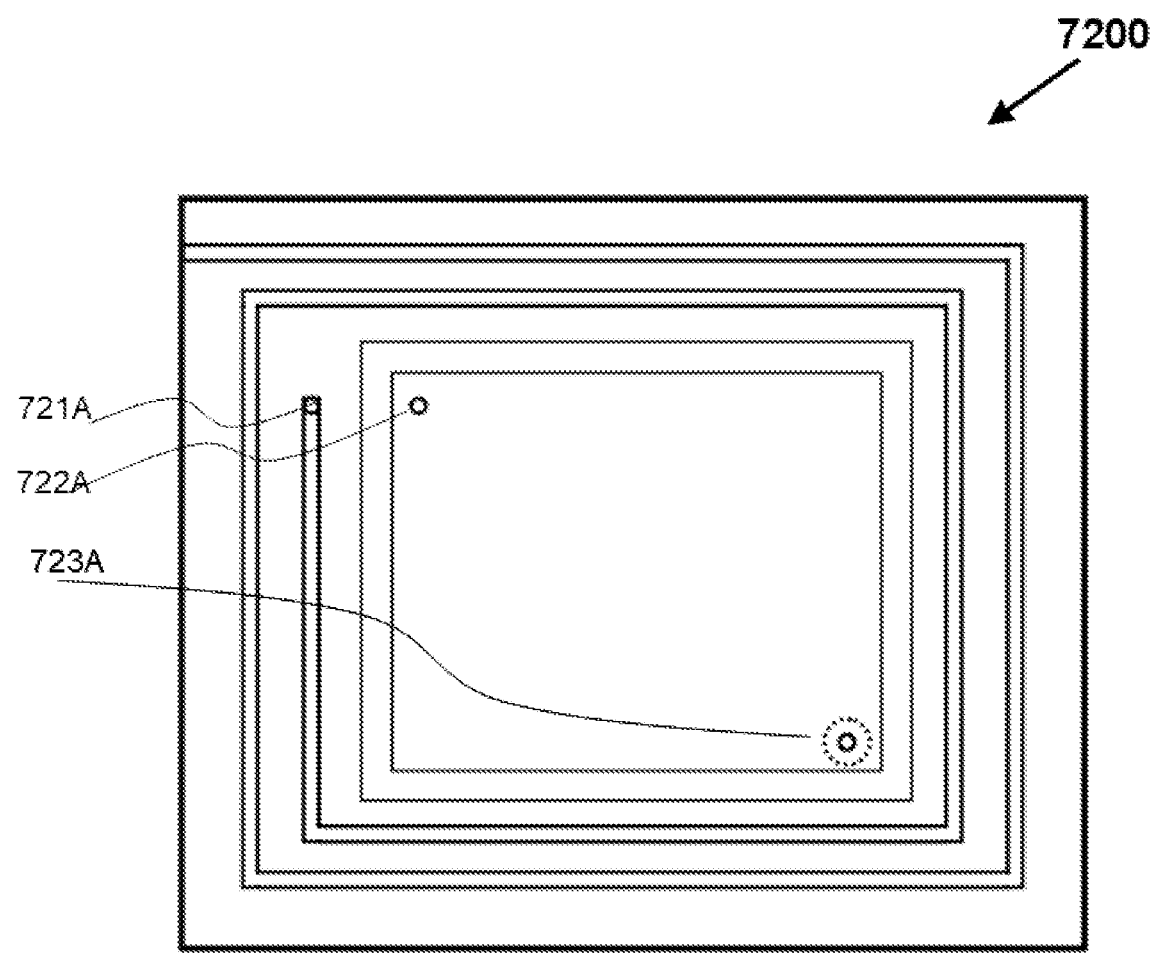
Figure 14:
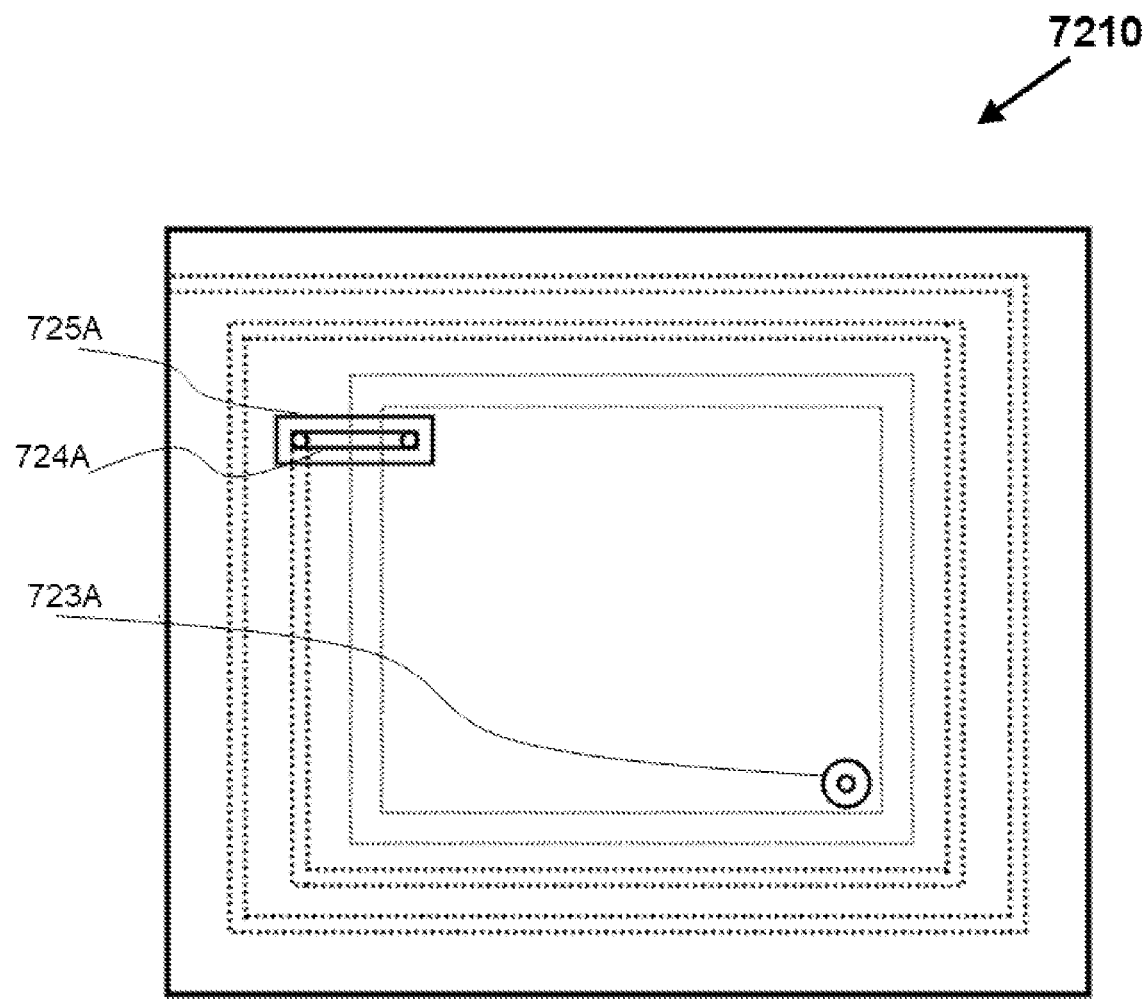
Figure 15:
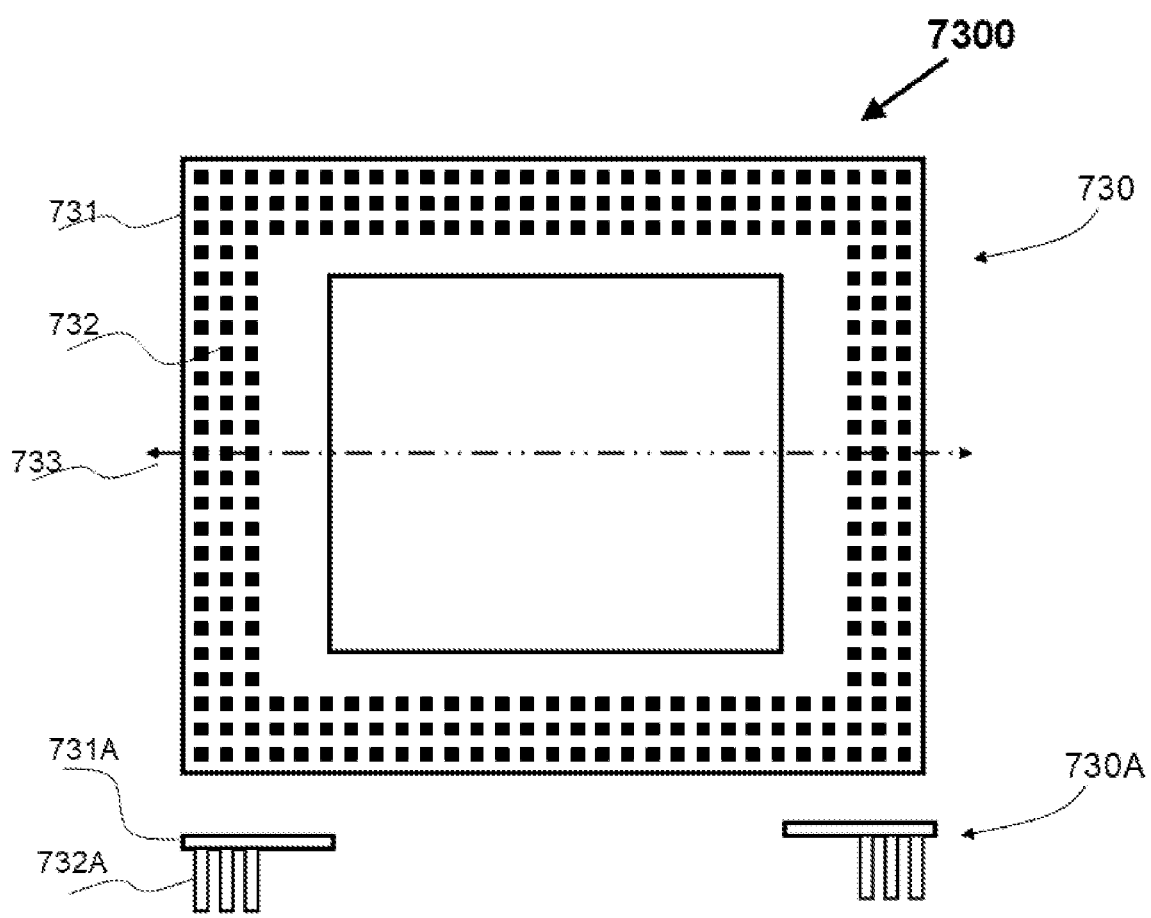
FIG. 15 to FIG. 17 are schematic diagrams for illustrating the steps of the method for making a lid, wherein a ring-form of covering piece, a bridging bar, a plug and a seal ring are formed of one preferred embodiment of the present invention.
Figure 16:
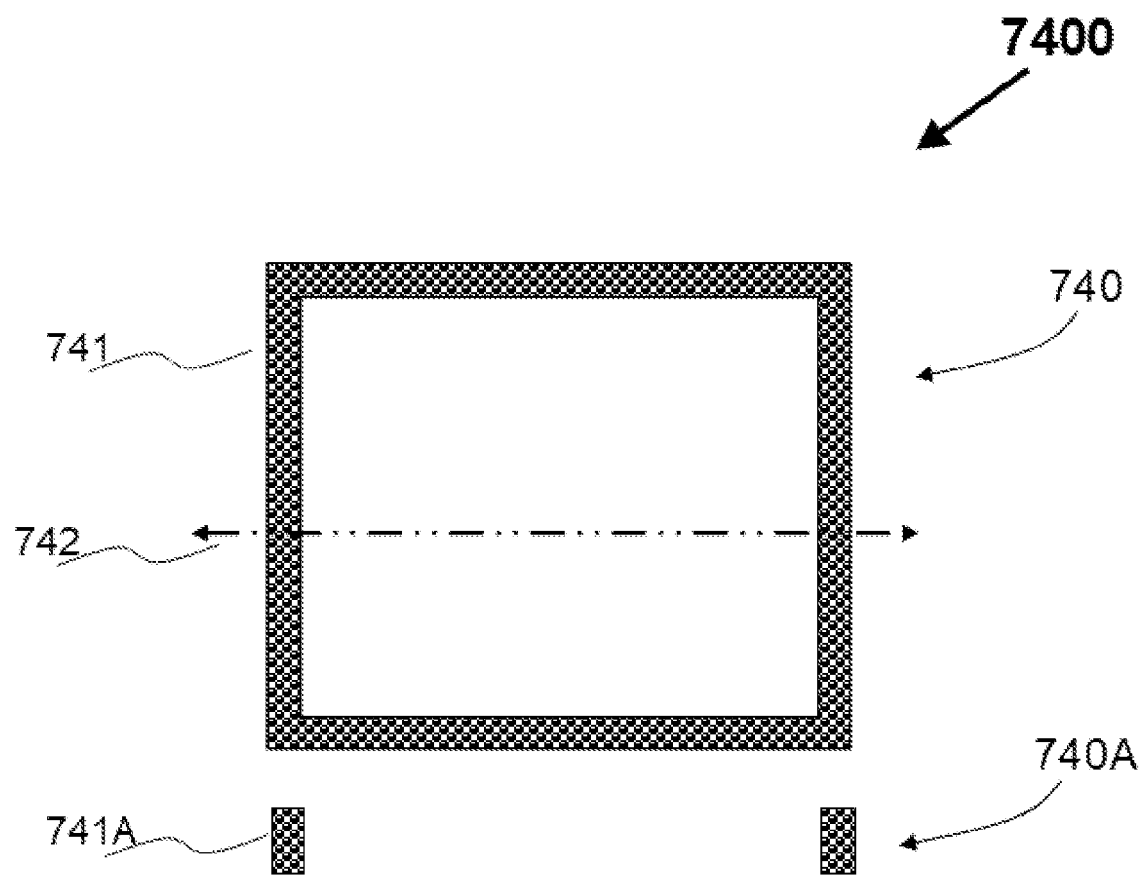
Figure 17:
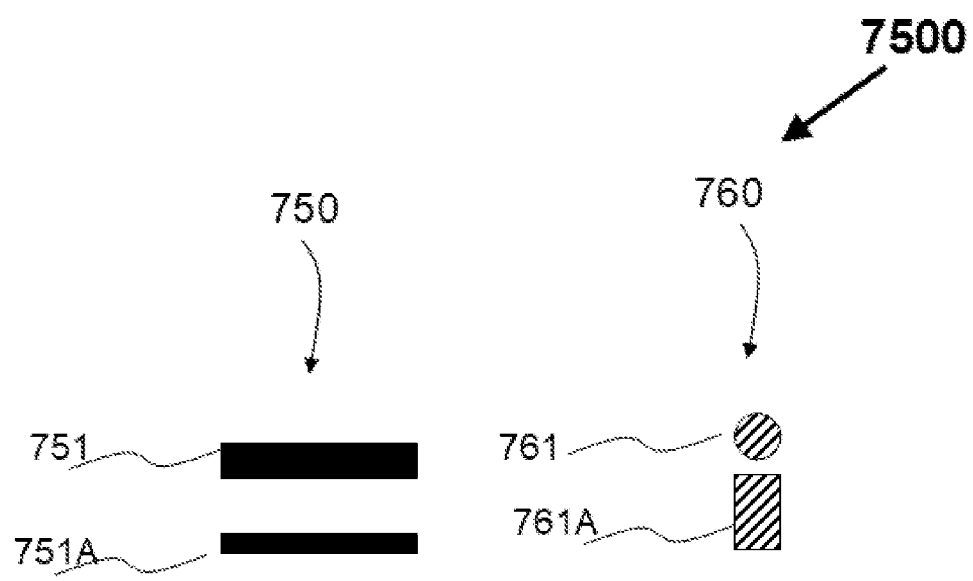
Figure 18:
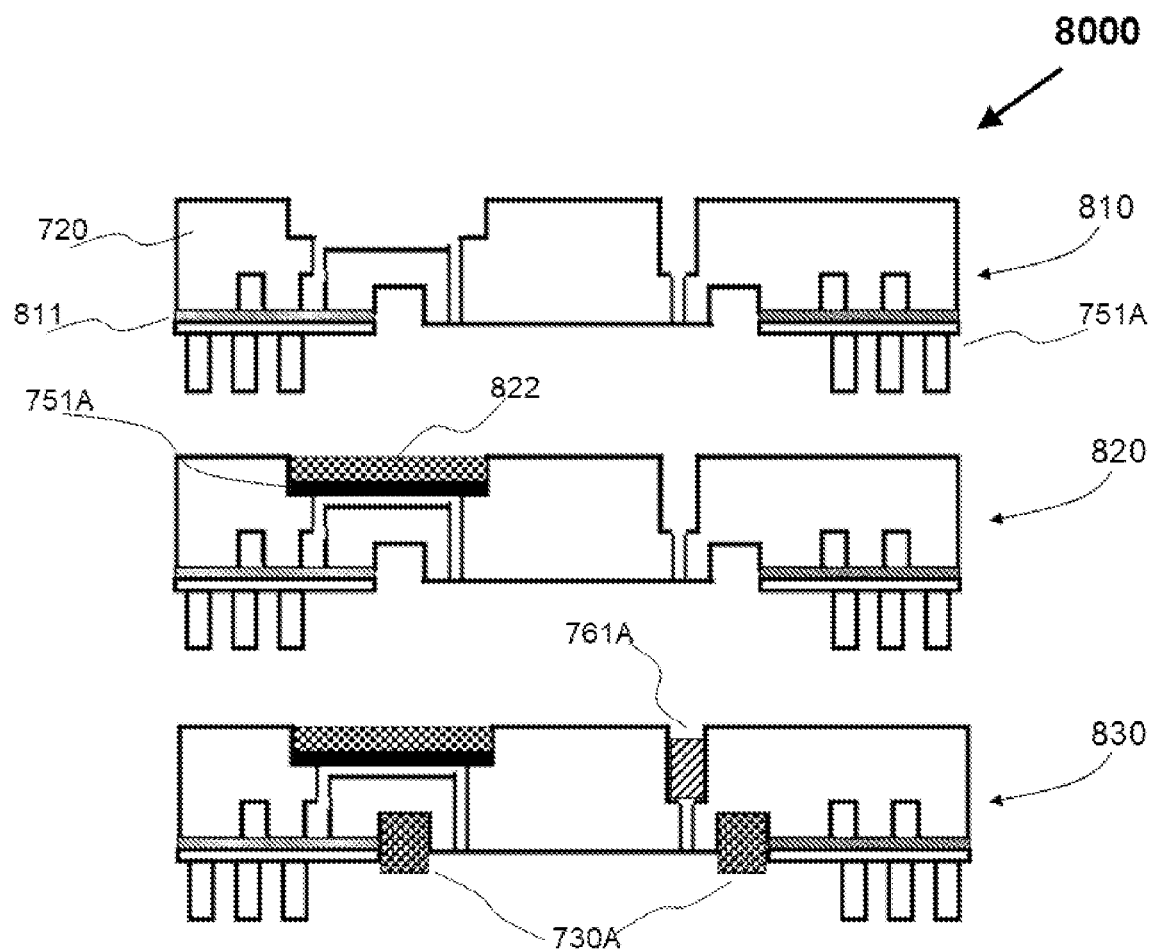
FIG. 18 is a schematic diagram for illustrating the steps of the method for making a lid, wherein the ring-form of covering piece, the bridging bar, the plug and the seal ring are assembled with the piece of material for forming the present lid of one preferred embodiment of the present invention.

FIG. 11 to FIG. 18 are schematic diagrams for illustrating a method for making a lid allowing for a liquid TIM in a lidded flip chip package of one preferred embodiment of the present invention. The numerical symbol 7000 in FIG. 11 designates the steps for forming some slots and holes in a piece of material, in which the 700 designates the step to prepare a piece of material, 710 designates the step to form a ring-form of slot 712 and a spiral pattern of slot 711 in the bottom surface of the piece of material, wherein the spiral pattern of slot 711 is outside and surrounding the ring-form of slot 712, and 720 designates the step to form an injection hole 723, two through holes 721 and 722 for making a connecting hole through a bridging bar later, and a step-form of rectangular slot 724 and 725. FIG. 12 to FIG. 14 are schematic diagrams for illustrating the bottom and top views of the piece of material after the previous steps. The numerical symbol 7100 in FIG. 12 is for illustrating the ring-form of slot 712 and the spiral pattern of slot 711 from their bottom view, in which the 712A and 711A designate the ring-form of slot 712 and the spiral pattern of slot 711 from their bottom view. The numerical symbol 7200 in FIG. 13 is for illustrating the through holes 721 and 722 and the injection hole 723 from their bottom view, in which the 721A and 722A designate the two through holes 721 and 722 and the 723A designates the injection hole from their bottom view. The numerical symbol 7210 in FIG. 14 is for illustrating the step-form of rectangular slot 724 and 725 from their bottom view, in which the 724A and 725A designate the rectangular slot 724 and 725 from their bottom view. The numerical symbol 7300 in FIG. 15 is for illustrating the step for forming a ring-form of covering piece with an array of pins, in which the 730 and 730A designate the bottom and cross-sectional views of the ring-form of covering piece with the array of pins, the 731 and 731A designate the ring-form of covering piece, the 732 and 732A designate the array of pins, and the 733 designates the location for the cross-section. The numerical symbol 7400 in FIG. 16 is for illustrating the step for forming a seal ring, in which the 740 and 740A designate the bottom and cross-sectional views of the seal ring, the 741 and 741A designate the seal ring, and the 742 designates the location for the cross-section. The numerical symbol 7500 in FIG. 17 is for illustrating the step for forming a bridging bar and a plug, in which the 750 and 760 designate the bridging bar and the plug, the 751 and 751A designate the bridging bar from its top and side view, and the 761 and 761A designate the plug 760 from its top and side view, respectively. The numerical symbol 8000 in FIG. 18 is for the steps to assemble the parts made from the previous steps together to form the lid, in which the 810 designates the step to bond the ring-form of covering piece with an array of pins 751A to the bottom surface of the piece of material 720 through an adhesive layer 811, the 820 designates the step to mount the bridging bar 821 in the step-form of rectangular slot 724 through an adhesive material 822 filled in the step-form of rectangular slot 725, and the 830 designates the step to mount the seal ring 730A and the plug 761A in the ring-form of slot and the injection hole.

Figure 19:
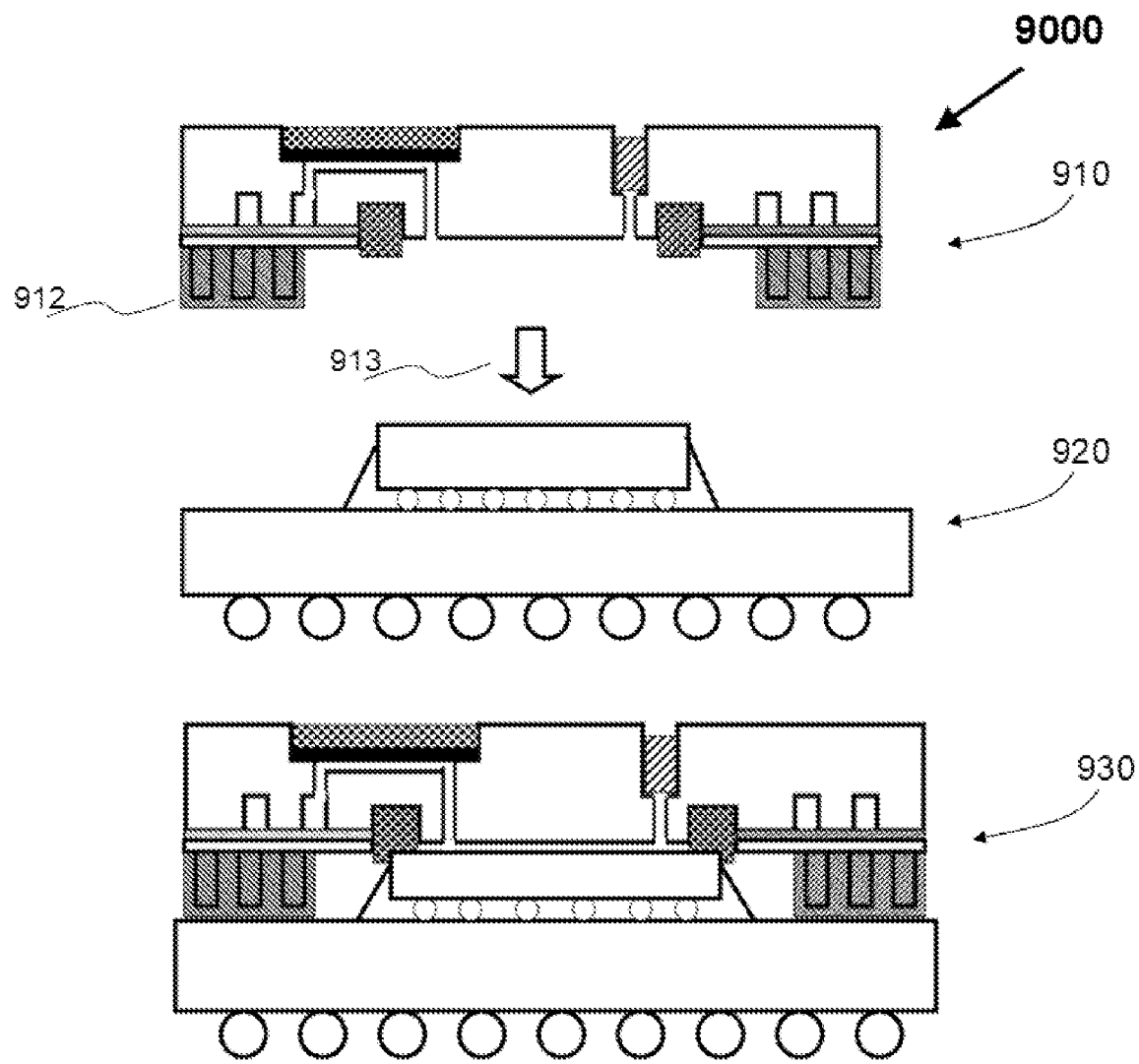
FIG. 19 is a schematic diagram for illustrating the step to bond the present lid with a flip chip package for forming a lidded flip chip package of one preferred embodiment of the present invention.
Figure 20:
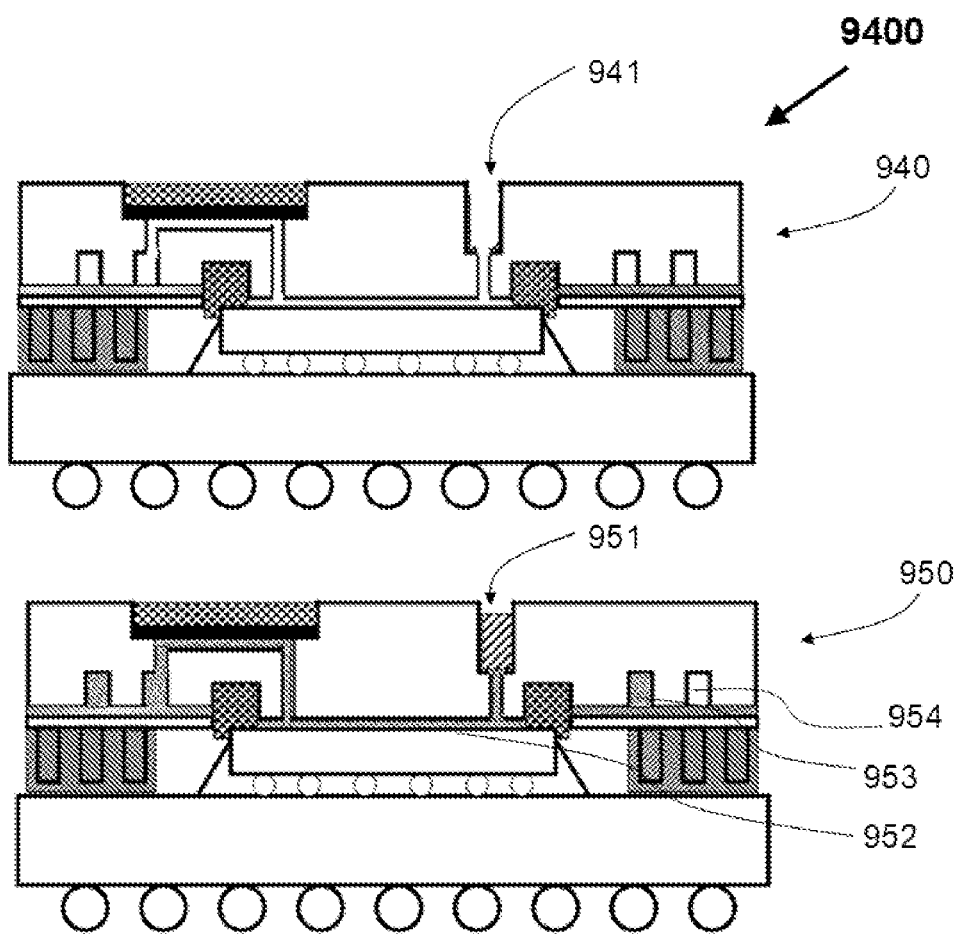
FIG. 20 is a schematic diagram for illustrating the step to fill a liquid material into the gap and the tunnel in the lidded flip chip package of one preferred embodiment of the present invention.
Figure 21:
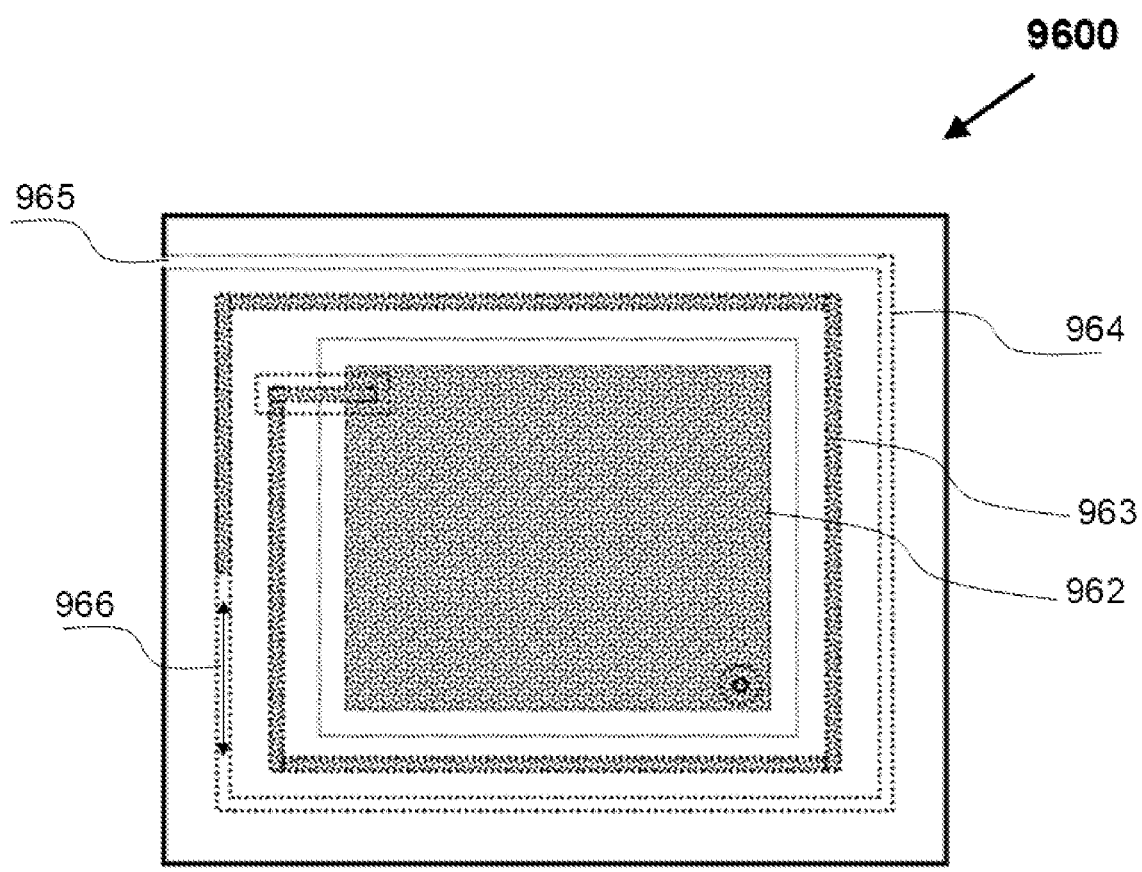
FIG. 21 is a schematic diagram for illustrating the liquid system in the lidded flip chip package of one preferred embodiment of the present invention.

FIG. 19 to FIG. 21 are schematic diagrams for illustrating the further steps of the method for making the lid allowing for a liquid TIM in a lidded flip chip package of one preferred embodiment of the present invention. The numerical symbol 9000 in FIG. 19 is for illustrating the step to attach the lid to a flip chip package to form a lidded flip chip package, in which the 910 designates the step to apply an adhesive material 912 to the array of pins, the arrow 913 designates to attach the lid onto the flip chip package 920 through the adhesive 912, forming the lidded flip chip package 930. The numerical symbol 9400 in FIG. 20 is for illustrating the step to fill the liquid into the gap and reservoir, in which the 941 designates the step to fill the liquid into the gap and the tunnel type of reservoir after removing the plug, and then the 951 designates the step to close the injection hole by putting back the plug, forming the lidded flip chip package 950 with a liquid TIM 952. The 952 and 953 designate the liquid in the gap and the tunnel, and the 954 designate the portion of the tunnel without the liquid. The numerical symbol 9600 in FIG. 21 is for illustrating the liquid system in the lidded flip chip package 950 in FIG. 20 from the top view of the liquid system, in which the 962 and 963 designate the liquid in the gap and the tunnel, the 964 designates the portion of the tunnel without the liquid, the 965 designates the opening of the tunnel to the ambient, and the arrow 966 means that the liquid can flow in and out when the gap volume changes.

Although the present invention is described in some details for illustrative purpose with reference to the specific embodiments and drawings, it is apparent that many other modifications and variations may be made without departing from the spirit and scope of the present invention.

What is claimed is:

1. A lid allowing for a liquid thermal interface material (TIM) in a lidded flip chip package, comprising:
a top piece, which has a top surface and a bottom surface and a plurality of pins; and a reservoir structure comprising:
a reservoir, a seal ring, and a connecting hole,
wherein the top piece of the lid has a ring-form of slot on its bottom surface and the seal ring is mounted in the ring-form of slot, the seal ring directly sealing a peripheral edge region at a top surface of a flip chip with a portion on the bottom surface of the top piece, providing a gap between a portion of the bottom surface of the top piece and a portion of the top surface of the flip chip, and the gap being entirely filled with a liquid, wherein the reservoir is a tunnel in the top piece of the lid, which has an opening to an ambient, and the tunnel being partially filled with a liquid, wherein the connecting hole has an end at a portion of the bottom surface of the top piece surrounded by the seal ring, and another end connecting to the reservoir,
wherein the top piece of the lid has an injection hole and a plug, the injection hole has an end at a portion of the bottom surface of the top piece surrounded by the seal ring, and another end at a portion of the top surface of the top piece is closed by the plug, and
wherein the plurality of pins extrude downwards from the portion of the bottom surface of the top piece outside the seal ring and form an array of pins, and an adhesive material fills among the pins and between the pins and a substrate of the lidded flip chip package so as to bond the lid with the substrate.

2. The lid of claim 1, wherein the injection hole is a screw hole, and the plug is a screw plug.

3. The lid of claim 1, wherein the injection hole is a blind hole, and the plug is a rubber plug.

4. The lid of claim 1, wherein the plurality of pins form a full array on the portion of the bottom surface of the top piece outside the seal ring.

5. The lid of claim 1, wherein the plurality of pins form a full array on the portion of the bottom surface of the top piece outside the seal ring and some pins are removed from the full array of pins so as to form a plurality of cavities.

6. The lid of claim 1, wherein the plurality of pins form a full array on the portion of the bottom surface of the top piece outside the seal ring and some pins are removed from the full array of pins so as to form a plurality of cavities, and the adhesive material also fills in the cavities.

7. The lid of claim 1, wherein the lid further comprises a foam block in the tunnel and near the opening of the tunnel.

8. The lid of claim 1, wherein the liquid in the gap and the liquid in the tunnel is a liquid metal, including gallium and gallium alloys.

9. The lid of claim 1, wherein the liquid in the gap and the liquid in the tunnel is a liquid metal, including gallium and gallium alloys and the lid further comprises another non-metallic liquid or grease material in the tunnel.

10. The lid of claim 1, wherein the liquid in the gap and the liquid in the tunnel is a liquid metal, including gallium and gallium alloys and the lid further comprises a movable block in the tunnel.

11. The lid of claim 1, wherein the seal ring also seals at one or more sides of the flip chip.

12. The lid of claim 1, wherein the reservoir is a spiral pattern of tunnel.

13. The lid of claim 1, wherein the lid further comprises a bridging bar for forming the connecting hole from the gap to the reservoir.

14. The lid of claim 1, wherein the lid further comprises a ring-form of covering piece, which includes an array of pins on its bottom surface, and its top surface is bonded with the portion of the bottom surface of the top piece outside the seal ring.

15. The lid of claim 1, wherein the lid is made based on a method, comprising the following major steps:
1) Prepare a piece of material,
2) Form a ring-form of slot and a spiral pattern of slot on a bottom surface of the piece of material, wherein the spiral pattern of slot is outside and surrounding the ring-form of slot,
3) Form two through holes for making a connecting hole and an injection hole, 4) Form a rectangular slot on the top surface of the piece of material for connecting the two through holes,
5) Form a ring-form of covering piece with an array of pins on its bottom surface,
6) Form a seal ring, a bridging bar, and a plug,
7) Bond a top surface of the ring-form of covering piece with the bottom surface of the piece of material so as to cover the spiral pattern of slot and form a spiral pattern of tunnel,
8) Mount the bridging bar into the rectangular slot for connecting the two through holes and forming a connecting hole from a portion of the bottom surface of the piece of material surrounded by the ring-form of slot to the spiral pattern of tunnel,
9) Place the plug into the injection hole,
10) Mount the seal ring in the ring-form of slot.

16. The lid of claim 15, wherein the method for making the lid further comprises the following steps:
11) Apply an adhesive material on the array of pins, and then attach the lid to a flip chip package,
12) Fill the liquid into the gap and the tunnel type of reservoir from the injection hole, and then close the injection hole by the plug.

* * * * *